United States Patent
Kim et al.

(10) Patent No.: US 9,990,251 B2
(45) Date of Patent: Jun. 5, 2018

(54) SEMICONDUCTOR SYSTEM WITH A COLUMN CONTROL CIRCUIT

(71) Applicant: SK hynix Inc., Icheon-si, Gyeonggi-do (KR)

(72) Inventors: Chang Hyun Kim, Seoul (KR); Jae Jin Lee, Gwangju-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 57 days.

(21) Appl. No.: 15/175,408

(22) Filed: Jun. 7, 2016

(65) Prior Publication Data
US 2017/0192845 A1 Jul. 6, 2017

(30) Foreign Application Priority Data
Jan. 5, 2016 (KR) .................. 10-2016-0001232

(51) Int. Cl.
| | | |
|---|---|---|
| *G06F 11/10* | (2006.01) | |
| *G11C 7/06* | (2006.01) | |
| *G11C 7/12* | (2006.01) | |
| *G11C 7/22* | (2006.01) | |
| *G11C 29/52* | (2006.01) | |
| *G11C 11/406* | (2006.01) | |

(Continued)

(52) U.S. Cl.
CPC .......... *G06F 11/1068* (2013.01); *G11C 7/065* (2013.01); *G11C 7/12* (2013.01);
(Continued)

(58) Field of Classification Search
CPC ....... G06F 11/1068; G11C 29/52; G11C 7/22; G11C 7/065; G11C 7/12;
(Continued)

(56) References Cited

U.S. PATENT DOCUMENTS

| | | | |
|---|---|---|---|
| 2004/0223395 A1* | 11/2004 | Huang ................. | G11C 7/1006 365/222 |
| 2006/0282755 A1* | 12/2006 | Oh ....................... | G06F 11/1052 714/801 |

(Continued)

FOREIGN PATENT DOCUMENTS

KR 1020140126220 A 10/2014

OTHER PUBLICATIONS

Y. Luo, Y. Cai, S. Ghose, J. Choi and O. Mutlu, "WARM: Improving NAND flash memory lifetime with write-hotness aware retention management," 2015 31st Symposium on Mass Storage Systems and Technologies (MSST), Santa Clara, CA, 2015, pp. 1-14.*

(Continued)

*Primary Examiner* — Cynthia Britt
(74) *Attorney, Agent, or Firm* — William Park & Associates Ltd.

(57) ABSTRACT

A semiconductor system may include a first semiconductor device and a second semiconductor device. The first semiconductor device may be configured to output command/address signals. The second semiconductor device may be configured to output data in a read operation during a refresh operation according to a combination of the command/address signals. The second semiconductor device may be configured to extract error information from the data. The second semiconductor device may be configured to corrects errors of the data using the error information in a write operation during the refresh operation to store the corrected data in the second semiconductor device and to store the error information in the second semiconductor device.

27 Claims, 12 Drawing Sheets

(51) Int. Cl.
*G11C 11/4094* (2006.01)
*G11C 29/18* (2006.01)
*G11C 29/42* (2006.01)

(52) U.S. Cl.
CPC ............ *G11C 7/22* (2013.01); *G11C 11/4094* (2013.01); *G11C 11/40611* (2013.01); *G11C 11/40618* (2013.01); *G11C 29/18* (2013.01); *G11C 29/42* (2013.01); *G11C 29/52* (2013.01); *G11C 2211/4062* (2013.01)

(58) Field of Classification Search
CPC . G11C 2211/4206; G11C 29/42; G11C 29/18; G11C 11/40618; G11C 11/4094; G11C 11/40611; G11C 2211/4062
USPC .......................................................... 714/754
See application file for complete search history.

(56) References Cited

U.S. PATENT DOCUMENTS

| | | | | |
|---|---|---|---|---|
| 2013/0246889 | A1 | 9/2013 | Kumar et al. | |
| 2014/0372791 | A1* | 12/2014 | Adachi | G06F 13/1689 714/5.1 |
| 2015/0143198 | A1* | 5/2015 | Chun | G06F 11/1072 714/768 |
| 2016/0026524 | A1* | 1/2016 | Hoya | G11C 11/16 714/764 |
| 2017/0123882 | A1* | 5/2017 | Healy | G06F 11/0727 |

OTHER PUBLICATIONS

S. S C. Vadapalli, H. Shetiya and S. Sethuraman, "Efficient Alternative to Intra Refresh using Reliable Reference Frames," 2007 IEEE International Conference on Multimedia and Expo, Beijing, 2007, pp. 124-127.*

Y. Katayama, Y. Negishi and S. Morioka, "Efficient error correction code configurations for quasi-nonvolatile data retention by DRAMs," Proceedings IEEE International Symposium on Defect and Fault Tolerance in VLSI Systems, Yamanashi, 2000, pp. 201-209.*

R. K. Venkatesan, S. Herr and E. Rotenberg, "Retention-aware placement in DRAM (RAPID): software methods for quasi-non-volatile DRAM," The Twelfth International Symposium on High-Performance Computer Architecture, 2006., 2006, pp. 155-165.*

* cited by examiner

US 9,990,251 B2

SEMICONDUCTOR SYSTEM WITH A COLUMN CONTROL CIRCUIT

CROSS-REFERENCE TO RELATED APPLICATIONS

The present application claims priority under 35 U.S.C 119(a) to Korean Patent Application No. 10-2016-0001232, filed on Jan. 5, 2016, which is incorporated herein by reference in its entirety.

BACKGROUND

1. Technical Field

Embodiments of the present disclosure generally relate to a semiconductor system, and more particularly to semiconductor system for correcting data errors.

2. Related Art

Semiconductor devices may be designed and fabricated to include a test mode function for evaluating the operation thereof. That is, various parameters of the semiconductor devices may be measured in a test mode at a wafer level or at a package level and the tested semiconductor devices may be sorted into passing chips or failed chips according to the test results.

Each of the semiconductor devices may execute a write operation and a read operation to receive and output a plurality of data through pads, and each semiconductor device may be evaluated by sensing logic levels of the data outputted from the pads.

As the semiconductor devices become more highly integrated with the development of fabrication process techniques, the number of failed memory cells in the tested semiconductor devices has been increased. Increase of the number of failed memory cells in the tested semiconductor devices may lead to not only reduction of production yield of the semiconductor devices but also difficulty in the guarantee of a large memory capacity of the semiconductor devices. Accordingly, error correction code (ECC) circuits have been widely employed in the semiconductor devices to solve data errors which are due to the failed memory cells.

DETAILED DESCRIPTION

Various embodiments may be directed to semiconductor systems correcting data errors.

According to an embodiment, a semiconductor system may include a first semiconductor device and a second semiconductor device. The first semiconductor device may output command/address signals. The second semiconductor device may output data in a read operation during a refresh operation according to a combination of the command/address signals. The second semiconductor device may extract error information from the data. The second semiconductor device may correct errors of the data using the error information in a write operation during the refresh operation to store the corrected data therein and to store the error information therein.

According to an embodiment, a semiconductor system may include a first semiconductor device and a second semiconductor device. The first semiconductor device may output command/address signals. The second semiconductor device may output data in a read operation during a first refresh operation according to a combination of the command/address signals, may extract error information on the data to store the error information therein, and may correct errors of the data stored in the memory cells which are selected according to the error information in a write operation during a second refresh operation to store the corrected data therein.

According to an embodiment, a semiconductor system may include a first semiconductor device and a second semiconductor device. The first semiconductor device may output command/address signals. The a second semiconductor device may output data in a read operation during a refresh operation according to a combination of the command/address signals, extract error information from the data, store the error information therein in a write operation during the refresh operation, and replace row addresses and column addresses for selecting the data having an error with other addresses according to the error information.

Various embodiments of the present disclosure will be described hereinafter with reference to the accompanying drawings. However, the embodiments described herein are for illustrative purposes only and are not intended to limit the scope of the present disclosure.

Figure 1:
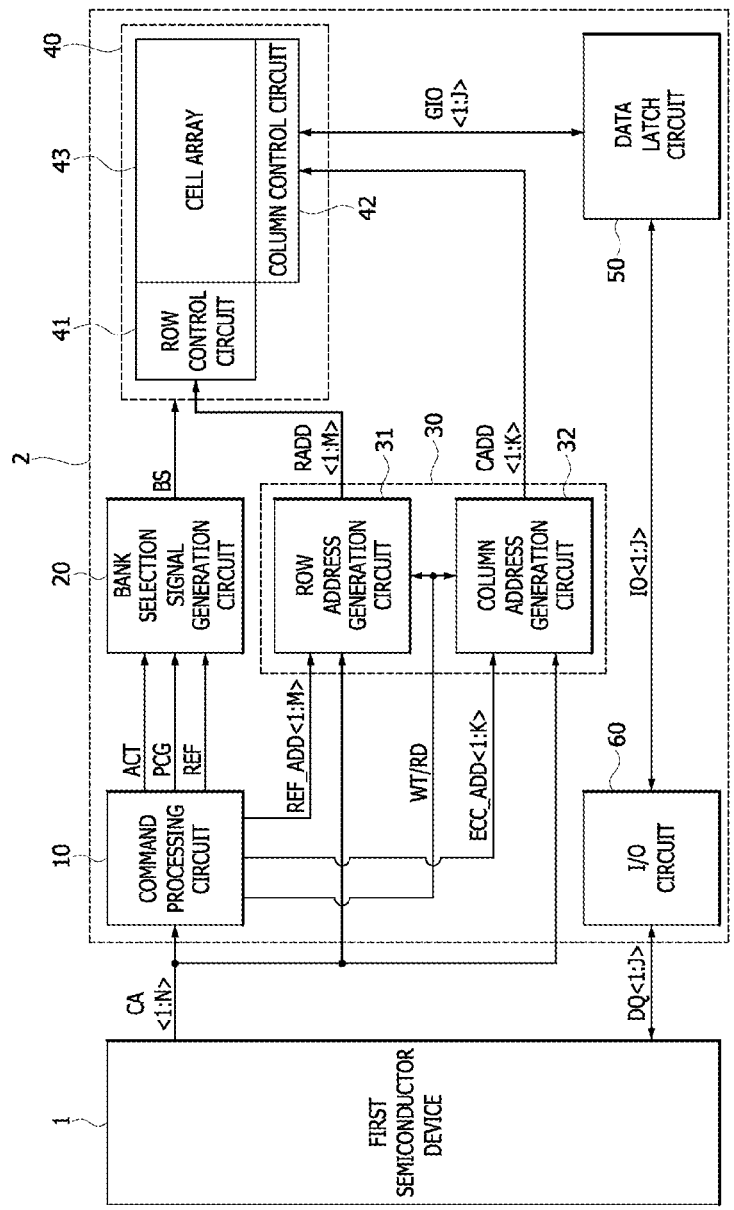
FIG. 1 is a block diagram illustrating a representation of an example a configuration of a semiconductor system according to an embodiment of the present disclosure.

Referring to FIG. 1, a semiconductor system according to an embodiment of the present disclosure may include a first semiconductor device 1 and a second semiconductor device 2. The second semiconductor device 2 may include a command processing circuit 10, a bank selection signal generation circuit 20, an address generation circuit 30, a memory area 40, a data latch circuit 50, and an input/output (I/O) circuit 60.

The first semiconductor device 1 may output first to $N^{th}$ command/address signals CA<1:N> and may receive or output first to $J^{th}$ external data DQ<1:J>. The first to $N^{th}$ command/address signals CA<1:N> and the first to $J^{th}$ external data DQ<1:J> may be transmitted through lines that transmit at least one group of addresses, commands, and data. Alternatively, the first to $N^{th}$ command/address signals CA<1:N> and the first to $J^{th}$ external data DQ<1:J> may be sequentially transmitted through one line. The number of bits of the first to $N^{th}$ command/address signals CA<1:N> and the number of bits of the first to $J^{th}$ external data DQ<1:J> may be set differently according to the embodiments. Numbers "N" and "3" of the first to $N^{th}$ command/address signals CA<1:N> and the first to $J^{th}$ external data DQ<1:J> may be set as natural numbers.

The command processing circuit 10 may decode the first to $N^{th}$ command/address signals CA<1:N> to generate an active signal ACT, a write signal WT, a read signal RD, a precharge signal PCG, and a refresh signal REF. The command processing circuit 10 may generate first to $M^{th}$ refresh addresses REF_ADD<1:M> and first to $K^{th}$ correction addresses ECC_ADD<1:K> which are sequentially counted, in response to the refresh signal REF. The active signal ACT may be set to be enabled by the first to $N^{th}$ command/address signals CA<1:N> in a write operation, a read operation, and a refresh operation. The write signal WT may be set to be enabled by the first to $N^{th}$ command/address signals CA<1:N> in the write operation. The read signal RD may be set to be enabled by the first to $N^{th}$ command/address signals CA<1:N> in the read operation. The refresh signal REF may be set to be enabled by the first to $N^{th}$ command/address signals CA<1:N> in the refresh operation. The precharge signal PCG may be set to be enabled after a predetermined time elapses from a point of time that the write operation, the read operation, or the refresh operation starts. The number of bits of the first to $M^{th}$ refresh addresses REF_ADD<1:M> and the number of bits of the first to $K^{th}$ correction addresses ECC_ADD<1:K> may be set differently according to the embodiments. Numbers "M" and "K" of the first to $M^{th}$ refresh addresses REF_ADD<1:M> and the first to $K^{th}$ correction addresses ECC_ADD<1:K> may be set as natural numbers. The numbers "M" and "K" of the first to $M^{th}$ refresh addresses REF_ADD<1:M> and the first to $K^{th}$ correction addresses ECC_ADD<1:K> may be set as natural numbers which are less than the number "N" of the first to $N^{th}$ command/address signals CA<1:N>.

The bank selection signal generation circuit 20 may generate a bank selection signal BS which is enabled in response to the active signal ACT, the precharge signal PCG, and the refresh signal REF. Although FIG. 1 illustrates an example in which the bank selection signal BS is indicated by a single signal line, the present disclosure is not limited thereto. For example, if the memory area 40 includes a plurality of memory banks, the bank selection signal BS may include a plurality of bank selection signals to select any one of the plurality of banks included in the memory area 40.

The address generation circuit 30 may include a row address generation circuit 31 and a column address generation circuit 32.

The row address generation circuit 31 may decode the first to $N^{th}$ command/address signals CA<1:N> to generate first to $M^{th}$ row addresses RADD<1:M> or may output the first to $M^{th}$ refresh addresses REF_ADD<1:M> as the first to $M^{th}$ row addresses RADD<1:M>, in response to the write signal WT and the read signal RD.

The column address generation circuit 32 may decode the first to $N^{th}$ command/address signals CA<1:N> to generate first to $K^{th}$ column addresses CADD<1:K> or may output the first to $K^{th}$ correction addresses ECC_ADD<1:K> as the first to $K^{th}$ column addresses CADD<1:K>, in response to the write signal WT and the read signal RD.

That is, the address generation circuit 30 may decode the first to $N^{th}$ command/address signals CA<1:N> to generate the first to $M^{th}$ row addresses RADD<1:M> and the first to $K^{th}$ column addresses CADD<1:K> in the write operation or the read operation. The address generation circuit 30 may output the first to $M^{th}$ refresh addresses REF_ADD<1:M> as the first to $M^{th}$ row addresses RADD<1:M> and may output the first to $K^{th}$ correction addresses ECC_ADD<1:K> as the first to $K^{th}$ column addresses CADD<1:K>, in the refresh operation.

The memory area 40 may include a row control circuit 41, a column control circuit 42, and a cell array 43. Here, the aforementioned bank may be configured to include the row control circuit 41, the column control circuit 42, and the cell array 43. The memory area 40 may be configured to include a plurality of banks.

The row control circuit 41 may selectively activate any one of a plurality of word lines (not illustrated) according to the first to $M^{th}$ row addresses RADD<1:M> in response to the bank selection signal BS.

The column control circuit 42 may select a plurality of memory cells (not illustrated) connected to the selected word line among the plurality of word lines (not illustrated) according to the first to $K^{th}$ column addresses CADD<1:K> in response to the bank selection signal BS and may extract error information from data stored in the selected memory cells (not illustrated). The column control circuit 42 may correct errors of the data using the extracted error information to store the corrected data in the selected memory cells (not illustrated) and may store the error information in parity cells (not illustrated). The column control circuit 42 may receive or output the data through first to $J^{th}$ global lines GIO<1:J>. Here, the error information means positional information of memory cells having a retention time (corresponding to a maximum time for which data of the memory cells can be maintained without any refresh operation after being written into the memory cells) which is less than a retention time of normal memory cells. The parity cells (not illustrated) may have the same structure as the memory cells (not illustrated).

The cell array 43 may include a plurality of memory cells (not illustrated) and a plurality of parity cells (not illustrated) which are connected to a plurality of word lines (not illustrated). The data may be stored in the memory cells (not illustrated), and the error information may be stored in the parity cells (not illustrated).

The data latch circuit 50 may latch the data loaded on the first to $J^{th}$ global lines GIO<1:J> to output the latched data to first to $J^{th}$ input and output (I/O) lines IO<1:J>. The data latch circuit 50 may latch the data loaded on the first to $J^{th}$ I/O lines IO<1:J> to output the latched data to the first to $J^{th}$ global lines GIO<1:J>.

The I/O circuit 60 may output the data on the first to $J^{th}$ I/O lines IO<1:J> as the first to $J^{th}$ external data DQ<1:J>. The I/O circuit 60 may output the first to $J^{th}$ external data DQ<1:J>, which are generated from the first semiconductor device 1, to the first to $J^{th}$ I/O lines IO<1:J>.

Figure 2:
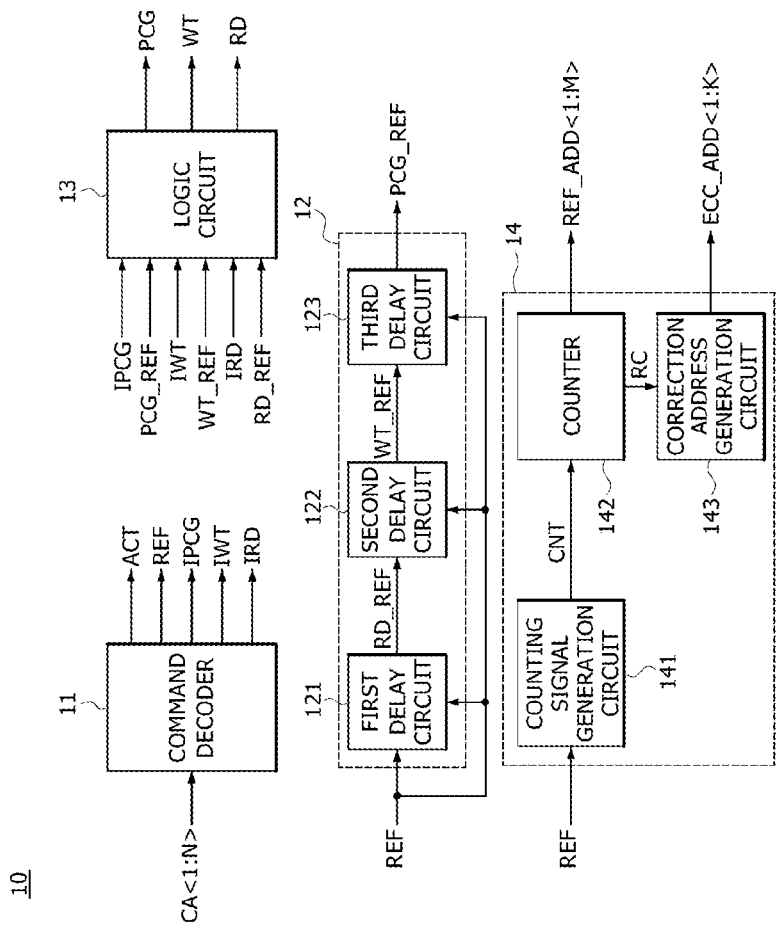
FIG. 2 is a block diagram illustrating a representation of an example of a command processing circuit included in the semiconductor system of FIG. 1.

Referring to FIG. 2, the command processing circuit 10 may include a command decoder 11, a delay setting circuit 12, a logic circuit 13, and a control circuit 14.

The command decoder 11 may decode the first to $N^{th}$ command/address signals CA<1:N> to generate the active signal ACT, the refresh signal REF, an internal precharge signal IPCG, an internal write signal IWT, and an internal read signal IRD.

The delay setting circuit 12 may include a first delay circuit 121, a second delay circuit 122, and a third delay circuit 123.

The first delay circuit 121 may delay the refresh signal REF by a first delay time to generate a refresh read signal RD_REF. The first delay time may be set as a row address strobe (RAS) to a column address strobe (CAS) delay time (tRCD).

The second delay circuit 122 may delay the refresh read signal RD_REF by a second delay time to generate a refresh write signal WT_REF. The second delay time may be set as a CAS to CAS delay time (tCCD).

The third delay circuit 123 may delay the refresh write signal WT_REF by a third delay time to generate a refresh precharge signal PCG_REF. The third delay time may be set as a write recovery time (tWR).

The first to third delay times may be set differently according to the embodiments.

For example, the delay setting circuit 12 may delay the refresh signal REF to generate the refresh read signal RD_REF, the refresh write signal WT_REF, and the refresh precharge signal PCG_REF which are sequentially enabled.

The logic circuit 13 may generate the precharge signal PCG which is enabled in response to the internal precharge signal IPCG or the refresh precharge signal PCG_REF. The logic circuit 13 may generate the write signal WT which is enabled in response to the internal write signal IWT or the refresh write signal WT_REF. The logic circuit 13 may generate the read signal RD which is enabled in response to the internal read signal IRD or the refresh read signal RD_REF.

The control circuit 14 may include a counting signal generation circuit 141, a counter 142, and a correction address generation circuit 143.

The counting signal generation circuit 141 may generate a counting signal CNT which is enabled after a predetermined time period from a point of time at which the refresh signal REF is inputted thereto.

The counter 142 may generate the first to $M^{th}$ refresh addresses REF_ADD<1:M> which are sequentially counted in response to the counting signal CNT. The counter 142 may generate a counting control signal RC which is enabled if the entire bits of the first to $M^{th}$ refresh addresses REF_ADD<1:M> are counted.

The correction address generation circuit 143 may generate the first to $K^{th}$ correction addresses ECC_ADD<1:K> which are sequentially counted in response to the counting control signal RC.

That is, the control circuit 14 may generate the first to $M^{th}$ refresh addresses REF_ADD<1:M> and the first to $K^{th}$ correction addresses ECC_ADD<1:K> which are sequentially counted in response to the refresh signal REF.

For example, the control circuit 14 may generate the first to $K^{th}$ correction addresses ECC_ADD<1:K> which are counted up by one bit if the entire bits of the first to $M^{th}$ refresh addresses REF_ADD<1:M> are counted in response to the refresh signal REF.

Figure 3:
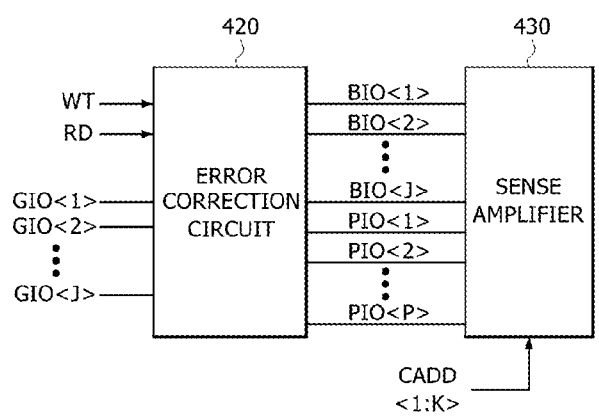
FIG. 3 is a block diagram illustrating a representation of an example of a column control circuit included in the semiconductor system of FIG. 2.

Referring to FIG. 3, the column control circuit 42 may include an error correction circuit 420 and a sense amplifier 430.

The error correction circuit 420 may extract error information from the data on first to $J^{th}$ bank lines BIO<1:J> which are connected to memory cells (not illustrated) in response to the read signal RD and may correct errors of the data using the error information to output the corrected data to the first to $J^{th}$ global lines GIO<1:J>. The error correction circuit 420 may output the corrected data to the first to $J^{th}$ bank lines BIO<1:J> and may output the error information to first to $P^{th}$ parity lines PIO<1:P>, in response to the write signal WT. Here, the number of the first to $P^{th}$ parity lines PIO<1:P> may be set differently according to the embodiments. The first to $P^{th}$ parity lines PIO<1:P> may be connected to the parity cells (not illustrated).

The sense amplifier 430 may sense and amplify the data on the first to $J^{th}$ bank lines BIO<1:J> connected to the memory cells that are selected by the first to $K^{th}$ column addresses CADD<1:K> and may store the sensed and amplified data therein. The sense amplifier 430 may store the error information loaded on the first to $P^{th}$ parity lines PIO<1:P> which are connected to the parity cells that are selected by the first to $K^{th}$ column addresses CADD<1:K>.

Figure 4:
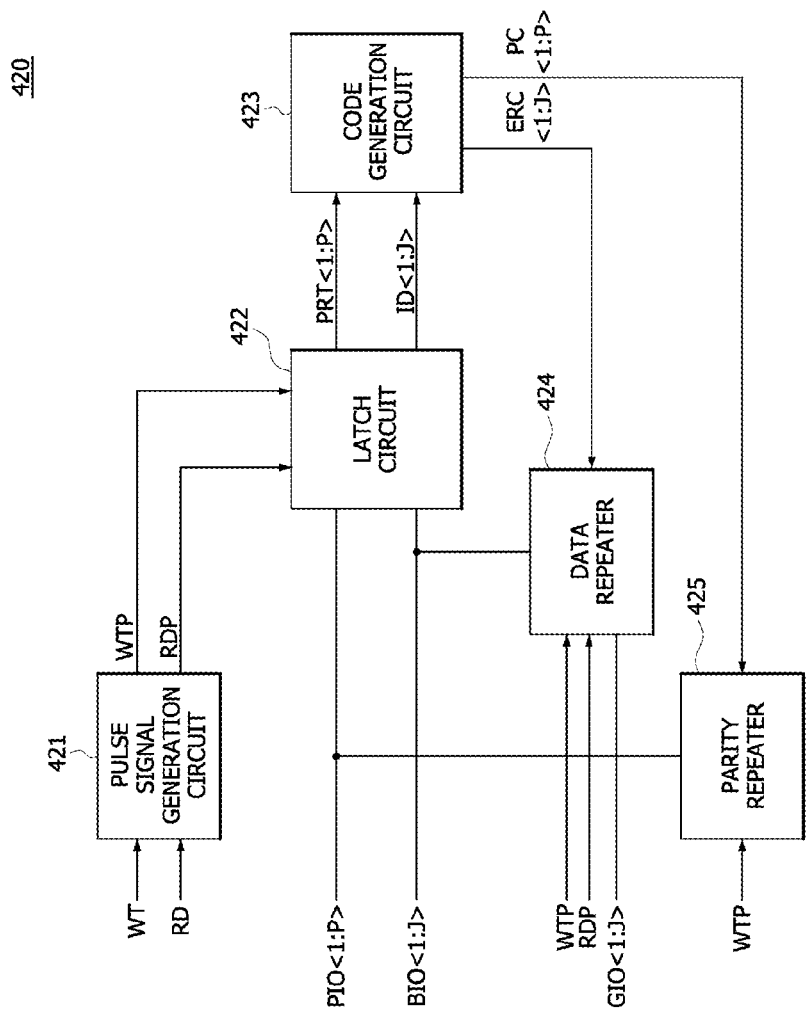
FIG. 4 is a block diagram illustrating a representation of an example of an error correction circuit included in the column control circuit of FIG. 3.

Referring to FIG. 4, the error correction circuit 420 may include a pulse signal generation circuit 421, a latch circuit 422, a code generation circuit 423, a data repeater 424, and a parity repeater 425.

The pulse signal generation circuit 421 may generate a write pulse signal WTP including a pulse that is generated in response to the write signal WT. The pulse signal generation circuit 421 may generate a read pulse signal RDP including a pulse that is generated in response to the read signal RD.

The latch circuit 422 may latch the data on the first to $J^{th}$ bank lines BIO<1:J> in response to the write pulse signal WTP or the read pulse signal RDP to generate first to $J^{th}$ internal data ID<1:J>. The latch circuit 422 may latch the error information on the first to $P^{th}$ parity lines PIO<1:P> in response to the read pulse signal RDP to generate first to $P^{th}$ parity signals PRT<1:P>.

The code generation circuit 423 may sense logic levels of the first to $J^{th}$ internal data ID<1:J> to generate first to $J^{th}$ error codes ERC<1:J> and first to $P^{th}$ parity codes PC<1:P> including the error information. The code generation circuit 423 may output the first to $P^{th}$ parity signals PRT<1:P> as the first to $P^{th}$ parity codes PC<1:P>. The first to $J^{th}$ error codes ERC<1:J> may include positional information on erroneous bits among the first to $J^{th}$ internal data ID<1:J>. For example, if the first error code ERC<1> is generated to have a logic high level, it means that the first internal datum ID<1> has an error. The first to $P^{th}$ parity codes PC<1:P> may be set as signals which include error information on the first to $J^{th}$ internal data ID<1:J>. The code generation circuit 423 may be realized using a general ECC circuit.

The data repeater 424 may output the data on the first to $J^{th}$ global lines GIO<1:J> to the first to $J^{th}$ bank lines BIO<1:J> in response to the write pulse signal WTP. The data repeater 424 may invert logic levels of the data on the first to $J^{th}$ bank lines BIO<1:J> according to the first to $J^{th}$ error codes ERC<1:J> to output the inverted data to the first to $J^{th}$ global lines GIO<1:J>, in response to the read pulse signal RDP.

The parity repeater 425 may output the first to $P^{th}$ parity codes PC<1:P> to the first to $P^{th}$ parity lines PIO<1:P> in response to the write pulse signal WTP.

Figure 5:
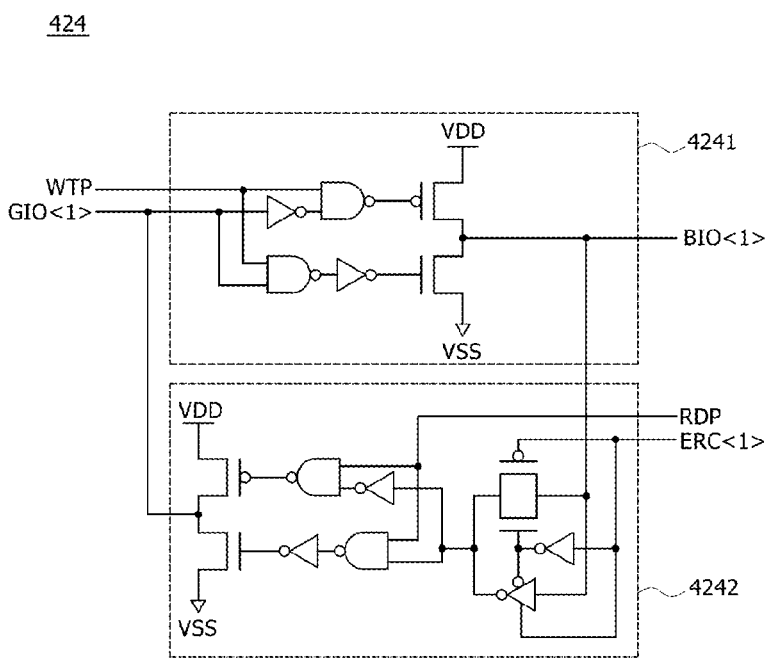
FIG. 5 is a circuit diagram illustrating a representation of an example of a data repeater included in the error correction circuit of FIG. 4.

Referring to FIG. 5, the data repeater 424 may include a first repeater 4241 and a second repeater 4242.

The first repeater 4241 may inversely buffer the datum on the first global line GIO<1> to output the inversely buffered datum to the first bank line BIO<1> in response to the write pulse signal WTP.

The second repeater 4242 may buffer the datum on the first bank line BIO<1> in response to the read pulse signal RDP to output the buffered datum to the first global line GIO<1>, if the first error code ERC<1> has a logic high level. The second repeater 4242 may inversely buffer the datum on the first bank line BIO<1> in response to the read pulse signal RDP to output the inversely buffered datum to the first global line GIO<1>, if the first error code ERC<1> has a logic low level. Here, if the first error code ERC<1> has a logic high level, it means that the datum on the first bank line BIO<1> has an error. If the first error code ERC<1> has a logic low level, it means that the datum on the first bank line BIO<1> has no error.

The data repeater 424 illustrated in FIG. 5 has a configuration in which the datum is inputted or outputted through the first global line GIO<1> or the first bank line BIO<1>. However, the data repeater 424 may be configured to have the first to $J^{th}$ global lines GIO<1:3> and the first to $J^{th}$ bank lines BIO<1:3> through which a plurality of data are inputted or outputted. That is, the data repeater 424 may be configured to include J-number of first repeaters and J-number of second repeaters.

Figure 6:
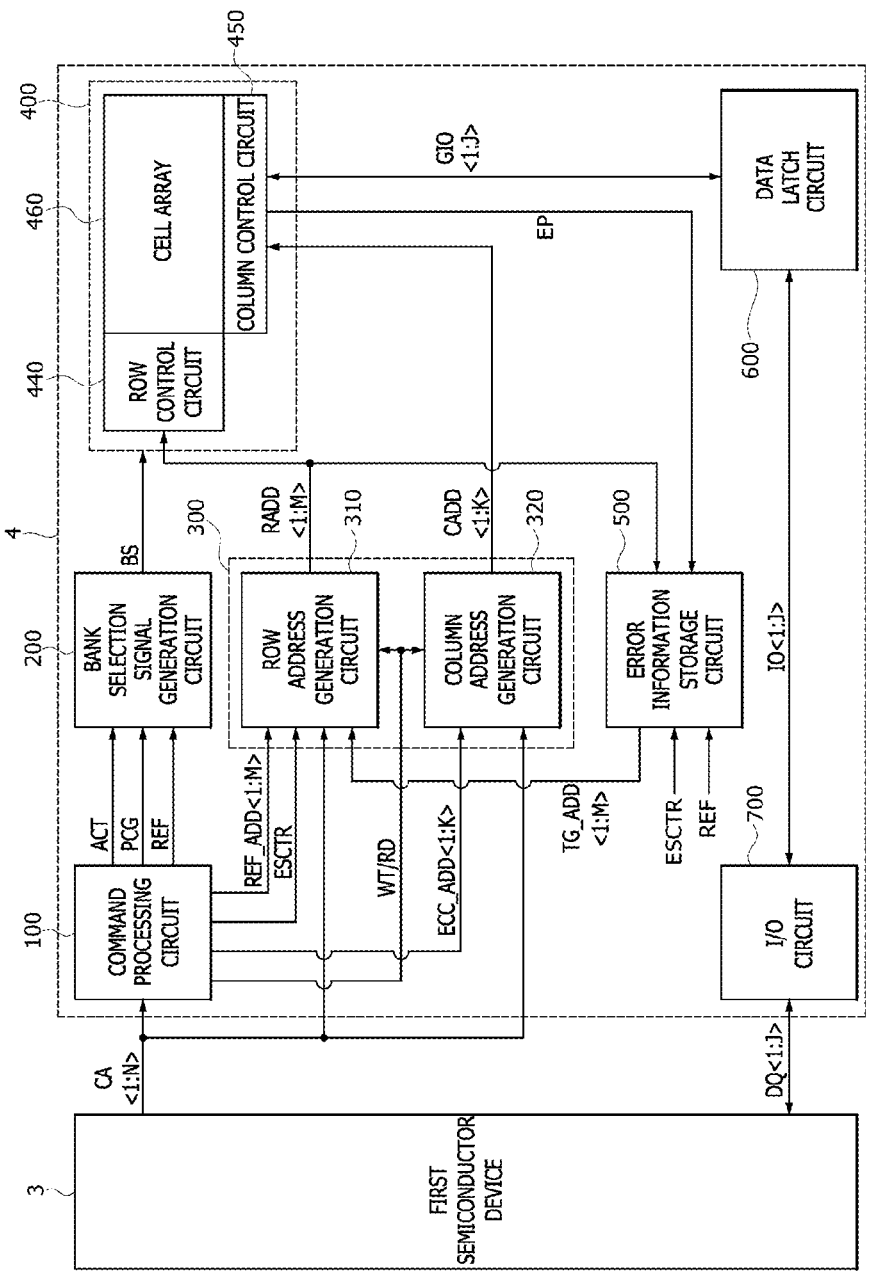
FIG. 6 is a block diagram illustrating a representation of an example a configuration of a semiconductor system according to an embodiment of the present disclosure.

FIG. 6 is a block diagram illustrating a configuration of a semiconductor system according to an embodiment of the present disclosure.

Referring to FIG. 6, a semiconductor system according to an embodiment of the present disclosure may include a first semiconductor device 3 and a second semiconductor device 4. The second semiconductor device 4 may include a command processing circuit 100, a bank selection signal generation circuit 200, an address generation circuit 300, a memory area 400, an error information storage circuit 500, a data latch circuit 600, and an I/O circuit 700.

The first semiconductor device 3 may output first to $N^{th}$ command/address signals CA<1:N> and may receive or output first to $J^{th}$ external data DQ<1:J>. The first to $N^{th}$ command/address signals CA<1:N> and the first to $J^{th}$ external data DQ<1:J> may be transmitted through lines that transmit at least one group of addresses, commands, and data. Alternatively, the first to $N^{th}$ command/address signals CA<1:N> and the first to $J^{th}$ external data DQ<1:J> may be continuously transmitted through one line. The number of bits of the first to $N^{th}$ command/address signals CA<1:N> and the number of bits of the first to $J^{th}$ external data DQ<1:J> may be set differently according to the embodiments. Numbers "N" and "3" of the first to $N^{th}$ command/address signals CA<1:N> and the first to $J^{th}$ external data DQ<1:J> may be set as natural numbers.

The command processing circuit 100 may decode the first to $N^{th}$ command/address signals CA<1:N> to generate an active signal ACT, a write signal WT, a read signal RD, a precharge signal PCG, a refresh signal REF, and a control signal ESCTR. The command processing circuit 100 may also generate first to $M^{th}$ refresh addresses REF_ADD<1:M> and first to $K^{th}$ correction addresses ECC_ADD<1:K> which are sequentially counted, in response to the refresh signal REF. The command processing circuit 100 may generate the control signal ESCTR which is enabled if the entire bits of the first to $K^{th}$ correction addresses ECC_ADD<1:K> are counted. The active signal ACT may be set to be enabled by the first to $N^{th}$ command/address signals CA<1:N> in a write operation, a read operation, and a refresh operation. The write signal WT may be set to be enabled by the first to $N^{th}$ command/address signals CA<1:N> in the write operation. The read signal RD may be set to be enabled by the first to $N^{th}$ command/address signals CA<1:N> in the read operation. The refresh signal REF may be set to be enabled by the first to $N^{th}$ command/address signals CA<1:N> in the refresh operation. The precharge signal PCG may be set as a signal which is enabled after a predetermined time from a point of time in which the write operation, the read operation, or the refresh operation starts. The number of bits of the first to $M^{th}$ refresh addresses REF_ADD<1:M> and the number of bits of the first to $K^{th}$ correction addresses ECC_ADD<1:K> may be set differently according to the embodiments. Numbers "M" and "K" of the first to $M^{th}$ refresh addresses REF_ADD<1:M> and the first to $K^{th}$ correction addresses ECC_ADD<1:K> may be set as natural numbers. The numbers "M" and "K" of the first to $M^{th}$ refresh addresses REF_ADD<1:M> and the first to $K^{th}$ correction addresses ECC_ADD<1:K> may be set as natural numbers which are less than the number "N" of the first to $N^{th}$ command/address signals CA<1:N>.

The bank selection signal generation circuit 200 may generate a bank selection signal BS which is enabled in response to the active signal ACT, the precharge signal PCG, and the refresh signal REF. The bank selection signal BS is illustrated as one signal for the sake of convenience of description, but may be configured by multiple signals to select any one of multiple banks which are included in the memory area 400.

The address generation circuit 300 may include a row address generation circuit 310 and a column address generation circuit 320.

The row address generation circuit 310 may decode the first to $N^{th}$ command/address signals CA<1:N> to generate first to $M^{th}$ row addresses RADD<1:M> or may output the first to $M^{th}$ refresh addresses REF_ADD<1:M> as the first to $M^{th}$ row addresses RADD<1:M>, in response to the write signal WT and the read signal RD. If the control signal ESCTR is enabled, for example, the row address generation circuit 310 may output first to $M^{th}$ target addresses TG_ADD<1:M> as the first to $M^{th}$ row addresses RADD<1:M>.

The column address generation circuit 320 may decode the first to $N^{th}$ command/address signals CA<1:N> to generate first to $K^{th}$ column addresses CADD<1:K> or may output the first to $K^{th}$ correction addresses ECC_ADD<1:K> as the first to $K^{th}$ column addresses CADD<1:K>, in response to the write signal WT and the read signal RD.

That is, the address generation circuit 300 may decode the first to $N^{th}$ command/address signals CA<1:N> in the write operation or the read operation to generate the first to $M^{th}$ row addresses RADD<1:M> and the first to $K^{th}$ column addresses CADD<1:K>. The address generation circuit 300 may output the first to $M^{th}$ refresh addresses REF_ADD<1:M> as the first to $M^{th}$ row addresses RADD<1:M> and may output the first to $K^{th}$ correction addresses ECC_ADD<1:K> as the first to $K^{th}$ column addresses CADD<1:K>, in a first refresh operation. The address generation circuit 300 may output the first to $M^{th}$ target addresses TG_ADD<1:M> as the first to $M^{th}$ row addresses RADD<1:M> in a second refresh operation. Here, the second refresh operation may correspond to an additional refresh operation executed after the first refresh operation.

The memory area 400 may include a row control circuit 440, a column control circuit 450, and a cell array 460. Here, the aforementioned bank may be configured to include the row control circuit 440, the column control circuit 450, and the cell array 460. The memory area 400 may be configured to include multiple banks.

The row control circuit 440 may selectively activate any one of multiple word lines (not illustrated) according to the first to $M^{th}$ row addresses RADD<1:M> in response to the bank selection signal BS.

The column control circuit 450 may select multiple memory cells (not illustrated) which are connected to the selected one of the multiple word lines (not illustrated) according to the first to $K^{th}$ column addresses CADD<1:K> in response to the bank selection signal BS and may extract error information from data stored in the selected multiple memory cells (not illustrated). The column control circuit 450 may generate an error pulse signal EP which is enabled if the data have an error. The column control circuit 450 may correct errors of the data using the extracted error information to store the corrected data in the multiple memory cells (not illustrated) and to store the error information in parity cells (not illustrated). The column control circuit 450 may receive or output the data through first to $J^{th}$ global lines GIO<1:J>. Here, the error information means positional information of memory cells having a retention time (corresponding to a maximum time for which data of the memory cells can be maintained without any refresh operation after being written into the memory cells) which is less than a retention time of normal memory cells.

In an embodiment, the column control circuit 450 may have substantially the same configuration as the column control circuit 42 illustrated in FIG. 3 to perform substantially the same operation, except for the error pulse signal EP. Thus, a detailed description of the column control circuit 450 will be omitted hereinafter to avoid duplicate explanation.

The cell array 460 may include multiple memory cells (not illustrated) and multiple parity cells (not illustrated) which are connected to multiple word lines (not illustrated). The data may be stored in the memory cells (not illustrated), and the error information may be stored in the parity cells (not illustrated).

The error information storage circuit 500 may store the first to $M^{th}$ row addresses RADD<1:M> as the first to $M^{th}$ target addresses TG_ADD<1:M> in response to the error pulse signal EP and may output the first to $M^{th}$ target addresses TG_ADD<1:M> in response to the control signal ESCTR.

The data latch circuit 600 may latch the data on the first to $J^{th}$ global lines GIO<1:3> to output the latched data to first to $J^{th}$ I/O lines IO<1:J>. The data latch circuit 600 may latch the data on the first to $J^{th}$ I/O lines IO<1:J> to output the latched data to the first to $J^{th}$ global lines GIO<1:J>.

The I/O circuit 700 may output the data on the first to $J^{th}$ I/O lines IO<1:J> as the first to $J^{th}$ external data DQ<1:J>. The I/O circuit 700 may output the first to $J^{th}$ external data DQ<1:J> generated from the first semiconductor device 3 to the first to $J^{th}$ I/O lines IO<1:J>.

Figure 7:
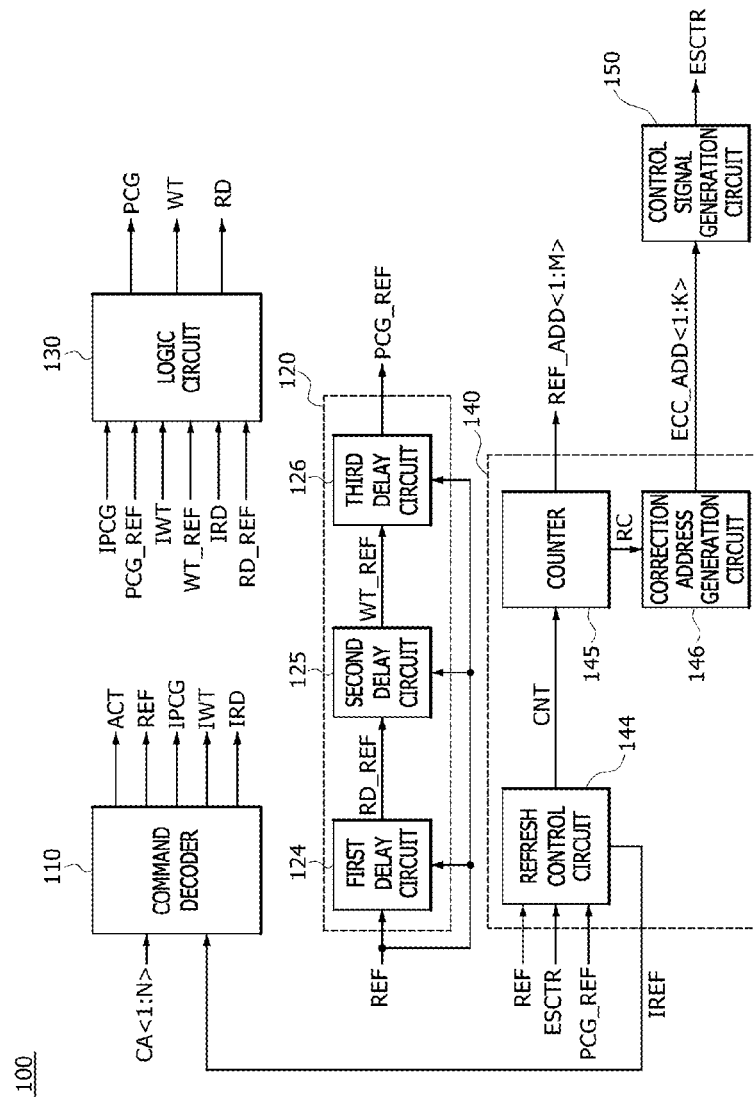
FIG. 7 is a block diagram illustrating a representation of an example of a command processing circuit included in the semiconductor system of FIG. 6.

Referring to FIG. 7, the command processing circuit 100 may include a command decoder 110, a delay setting circuit 120, a logic circuit 130, a control circuit 140, and a control signal generation circuit 150.

The command decoder 110 may decode the first to $N^{th}$ command/address signals CA<1:N> to generate the active signal ACT, the refresh signal REF, an internal precharge signal IPCG, an internal write signal IWT, and an internal read signal IRD. The command decoder 110 may regenerate the refresh signal REF in response to an internal refresh signal IREF.

The delay setting circuit 120 may include a first delay circuit 124, a second delay circuit 125, and a third delay circuit 126.

The first delay circuit 124 may delay the refresh signal REF by a first delay time to generate a refresh read signal RD_REF. The first delay time may be set as a row address strobe (RAS) to a column address strobe (CAS) delay time (tRCD).

The second delay circuit 125 may delay the refresh read signal RD_REF by a second delay time to generate a refresh write signal WT_REF. The second delay time may be set as a CAS to CAS delay time (tCCD).

The third delay circuit 126 may delay the refresh write signal WT_REF by a third delay time to generate a refresh precharge signal PCG_REF. The third delay time may be set as a write recovery time (tWR).

The first to third delay times may be set differently according to the embodiments.

For example, the delay setting circuit 120 may delay the refresh signal REF to generate the refresh read signal RD_REF, the refresh write signal WT_REF, and the refresh precharge signal PCG_REF which are sequentially enabled.

The logic circuit 130 may generate the precharge signal PCG which is enabled in response to the internal precharge signal IPCG or the refresh precharge signal PCG_REF. The logic circuit 130 may generate the write signal WT which is enabled in response to the internal write signal IWT or the refresh write signal WT_REF. The logic circuit 130 may generate the read signal RD which is enabled in response to the internal read signal IRD or the refresh read signal RD_REF.

The control circuit 140 may include a refresh control circuit 144, a counter 145, and a correction address generation circuit 146.

The refresh control circuit 144 may generate a counting signal CNT which is enabled after a predetermined time period from a point of time at which the refresh signal REF is inputted thereto. The refresh control circuit 144 may generate the internal refresh signal IREF which is enabled at a point of time when the refresh precharge signal PCG_REF is enabled after the refresh signal REF is enabled in response to the control signal ESCTR.

The counter 145 may generate the first to $M^{th}$ refresh addresses REF_ADD<1:M> which are sequentially counted in response to the counting signal CNT. The counter 145 may generate a counting control signal RC which is enabled if the entire bits of the first to $M^{th}$ refresh addresses REF_ADD<1:M> are counted.

The correction address generation circuit 146 may generate the first to $K^{th}$ correction addresses ECC_ADD<1:K> which are sequentially counted in response to the counting control signal RC.

For example, the control circuit 140 may generate the first to $M^{th}$ refresh addresses REF_ADD<1:M> and the first to $K^{th}$ correction addresses ECC_ADD<1:K> which are sequentially counted in response to the refresh signal REF. The control circuit 140 may generate the internal refresh signal IREF which is enabled after a predetermined time period from a point of time when the refresh signal REF is inputted thereto, in response to the control signal ESCTR. Here, the predetermined time period means a time period from a point of time at which the refresh signal REF is enabled till a point of time at which the refresh precharge signal PCG_REF is enabled.

For example, the control circuit 140 may generate the first to $K^{th}$ correction addresses ECC_ADD<1:K> which are counted up by one bit if the entire bits of the first to $M^{th}$ refresh addresses REF_ADD<1:M> are counted in response to the refresh signal REF.

The control signal generation circuit 150 may generate the control signal ESCTR which is enabled if the entire bits of the first to $K^{th}$ correction addresses ECC_ADD<1:K> are counted.

Figure 8:
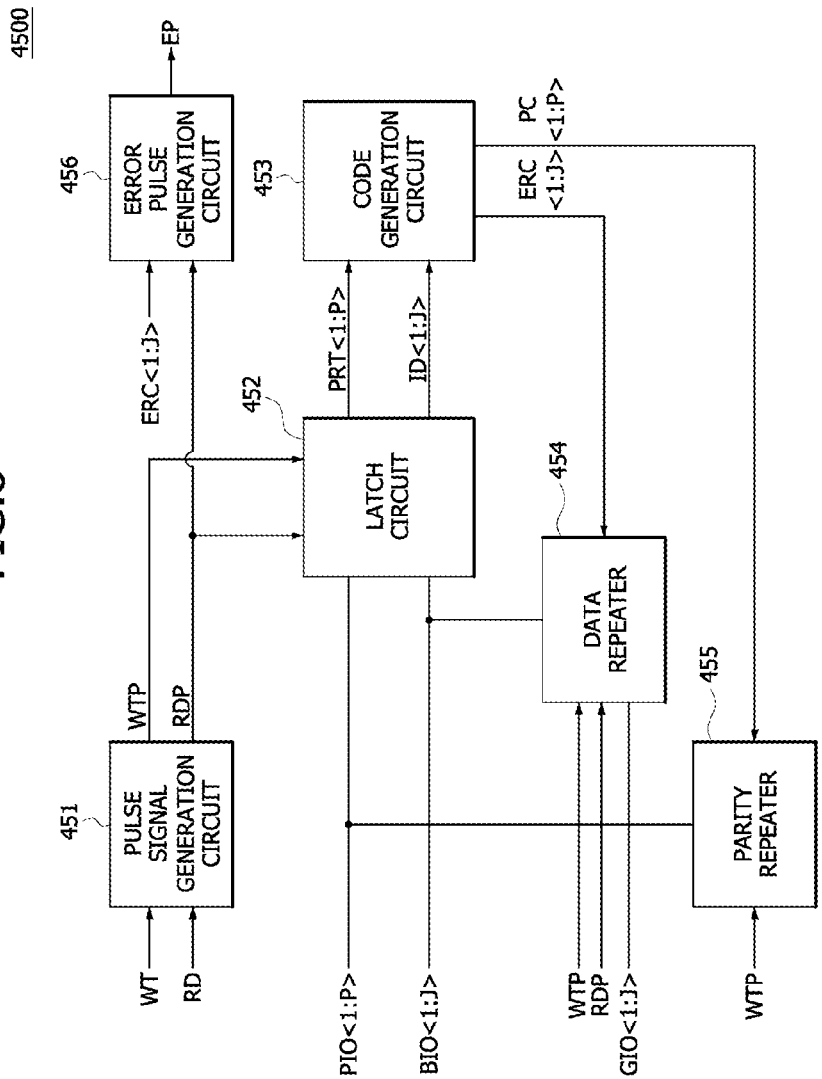
FIG. 8 is a block diagram illustrating a representation of an example of an error correction circuit included in a column control circuit of the semiconductor system illustrated in FIG. 6.

Referring to FIG. 8, the error correction circuit 4500 included in the column control circuit 450 may include a pulse signal generation circuit 451, a latch circuit 452, a code generation circuit 453, a data repeater 454, a parity repeater 455, and an error pulse generation circuit 456.

The pulse signal generation circuit 451 may generate a write pulse signal WTP including a pulse that is generated in response to the write signal WT. The pulse signal generation circuit 451 may generate a read pulse signal RDP including a pulse that is generated in response to the read signal RD.

The latch circuit 452 may latch the data on the first to $J^{th}$ bank lines BIO<1:J> in response to the write pulse signal WTP or the read pulse signal RDP to generate first to $J^{th}$ internal data ID<1:J>. The latch circuit 452 may latch the error information on the first to $P^{th}$ parity lines PIO<1:P> in response to the read pulse signal RDP to generate first to $P^{th}$ parity signals PRT<1:P>.

The code generation circuit 453 may sense logic levels of the first to $J^{th}$ internal data ID<1:J> to generate the first to $J^{th}$ error codes ERC<1:J> and first to $P^{th}$ parity codes PC<1:P> including the error information. The code generation circuit 453 may output the first to $P^{th}$ parity signals PRT<1:P> as the first to $P^{th}$ parity codes PC<1:P>. The first to $J^{th}$ error codes ERC<1:J> may include positional information on erroneous bits among the first to $J^{th}$ internal data ID<1:J>. For example, if the first error code ERC<1> has a logic high level, it means that the first internal datum ID<1> has an error. The first to $P^{th}$ parity codes PC<1:P> may be set as signals including error information on the first to $J^{th}$ internal data ID<1:J>. The code generation circuit 453 may be realized using a general ECC circuit.

The data repeater 454 may output the data on the first to $J^{th}$ global lines GIO<1:J> to the first to $J^{th}$ bank lines BIO<1:J> in response to the write pulse signal WTP. The data repeater 454 may invert logic levels of the data on the first to $J^{th}$ bank lines BIO<1:J> according to the first to $J^{th}$ error codes ERC<1:J> to output the inverted data to the first to $J^{th}$ global lines GIO<1:J>, in response to the read pulse signal RDP. The data repeater 454 has the same configuration as the data repeater 424 illustrated in FIG. 5 to perform the same operation. Thus, a detailed description of the data repeater 454 will be omitted hereinafter to avoid duplicate explanation.

The parity repeater 455 may output the first to $P^{th}$ parity codes PC<1:P> to the first to $P^{th}$ parity lines PIO<1:P> in response to the write pulse signal WTP.

The error pulse generation circuit 456 may generate an error pulse signal EP including a pulse that is generated if at least one of the first to $J^{th}$ error codes ERC<1:J> is enabled, in response to the read pulse signal RDP.

Figure 9:
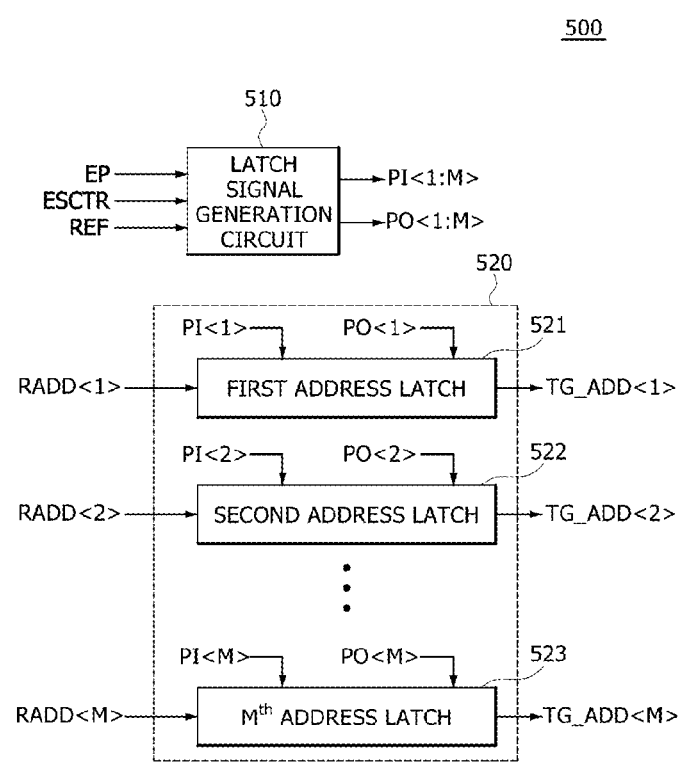
FIG. 9 is a block diagram illustrating a representation of an example of an error information storage circuit included in the semiconductor system of FIG. 6.

Referring to FIG. 9, the error information storage circuit 500 may include a latch signal generation circuit 510 and an address latch circuit 520. The address latch circuit 520 may include first to $M^{th}$ address latches 521 to 523.

The latch signal generation circuit 510 may generate first to $M^{th}$ input latch signals PI<1:M> which are enabled at a point of time when the error pulse signal EP is generated, in response to the refresh signal REF, and may generate first to $M^{th}$ output latch signals PO<1:M> which are enabled after a predetermined time period from a point of time when the refresh signal REF is inputted thereto, in response to the control signal ESCTR.

The first address latch 521 may latch the first row address RADD<1> in response to the first input latch signal PI<1> and may output the latched first row address RADD<1> as the first target address TG_ADD<1> in response to the first output latch signal PO<1>.

The second address latch 522 may latch the second row address RADD<2> in response to the second input latch signal PI<2> and may output the latched second row address RADD<2> as the second target address TG_ADD<2> in response to the second output latch signal PO<2>.

The $M^{th}$ address latch 523 may latch the $M^{th}$ row address RADD<M> in response to the $M^{th}$ input latch signal PI<M> and may output the latched $M^{th}$ row address RADD<M> as the $M^{th}$ target address TG_ADD<M> in response to the $M^{th}$ output latch signal PO<M>.

Each of the third to $(M-1)^{th}$ address latches may have the same configurations as one of the first address latch 521, the second address latch 522, and the $M^{th}$ address latch 523 except the input and output signals. Thus, detailed descriptions of the third to $(M-1)^{th}$ address latches will be omitted hereinafter to avoid duplicate explanation.

For example, the error information storage circuit 500 may latch the first to $M^{th}$ row addresses RADD<1:M> to generate the first to $M^{th}$ target addresses TG_ADD<1:M> including positional information on memory cells having erroneous data at a point of time when errors occur.

Figure 10:
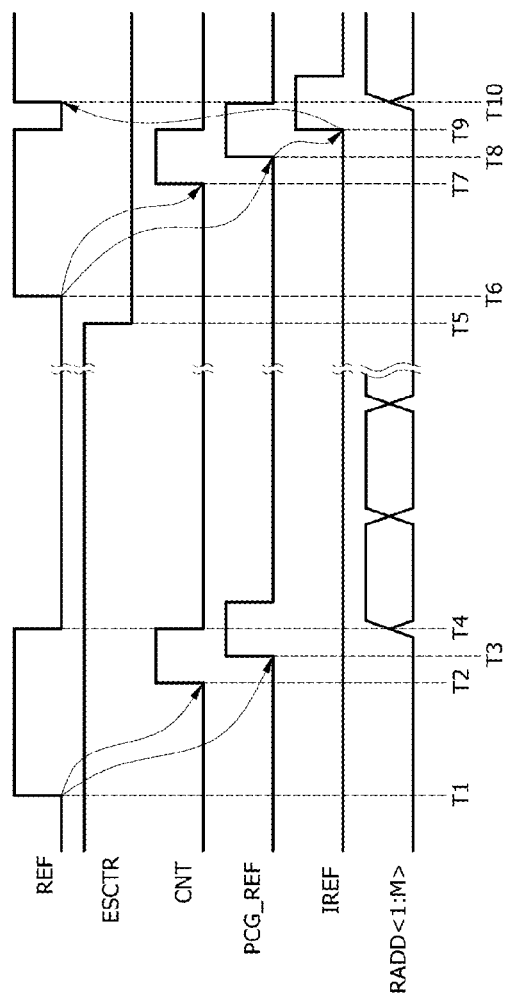
FIG. 10 is a timing diagram illustrating a representation of an example of an operation of a semiconductor system according to an embodiment of the present disclosure.

An operation of a semiconductor system having an aforementioned configuration will be described hereinafter with reference to FIG. 10 in conjunction with an example in which errors of data occur in a first refresh operation and the errors of the data are corrected in a second refresh operation.

At point of time T1, the first semiconductor device 3 may output the first to $N^{th}$ command/address signals CA<1:N> to start the refresh operation.

The command decoder 110 of the command processing circuit 100 may decode the first to $N^{th}$ command/address signals CA<1:N> to generate the refresh signal REF having a logic high level.

At a point of time T2, the refresh control circuit 144 of the command processing circuit 100 may generate the counting signal CNT which is enabled to have a logic high level after a predetermined time period from the point of time T1 when the refresh signal REF is inputted thereto.

At a point of time T3, the delay setting circuit 120 may delay the refresh signal REF to generate the refresh precharge signal PCG_REF. A time from the point of time T2 to the point of time T3 may correspond to a sum of delay times of the first to third delay circuits 124 to 126. That is, the time from the point of time T2 to the point of time T3 may correspond to a sum of a RAS to CAS delay time (tRCD), a CAS to CAS delay time (tCCD) and a write recovery time (tWR).

At a point of time T4, the counter 145 of the control circuit 140 may count the first to $M^{th}$ row addresses RADD<1:M> in response to the counting signal CNT generated at the point of time T2. The counter 145 of the control circuit 140 may count the entire bits of the first to $M^{th}$ row addresses RADD<1:M> after the point of time T4. At this time, the correction address generation circuit 146 may count the entire bits of the first to $K^{th}$ correction addresses ECC_ADD<1:K>.

At a point of time T5, the control signal generation circuit 150 may generate the control signal ESCTR which is enabled to have a logic low level by counting the entire bits of the first to $K^{th}$ correction addresses ECC_ADD<1:K>.

At a point of time T6, the first semiconductor device 3 may output the first to $N^{th}$ command/address signals CA<1:N> to start the refresh operation.

The command decoder 110 of the command processing circuit 100 may decode the first to $N^{th}$ command/address signals CA<1:N> to generate the refresh signal REF having a logic high level. Here, the refresh signal REF generated by the first to $N^{th}$ command/address signals CA<1:N> means a signal for executing the first refresh operation.

At a point of time T7, the refresh control circuit 144 of the command processing circuit 100 may generate the counting signal CNT which is enabled to have a logic high level. That is, the refresh control circuit 144 may generate the counting signal CNT having a logic high level after a predetermined time period from the point of time T6 when the refresh signal REF is inputted thereto.

At a point of time T8, the delay setting circuit 120 may delay the refresh signal REF generated at the point of time T6 to generate the refresh precharge signal PCG_REF. A time from the point of time T6 to the point of time T8 may correspond to a sum of the delay times of the first to third delay circuits 124 to 126. That is, the time from the point of time T6 to the point of time T8 may be set as a sum of a RAS to CAS delay time (tRCD), a CAS to CAS delay time (tCCD) and a write recovery time (tWR).

At a point of time T9, the refresh control circuit 144 may generate the internal refresh signal IREF which is enabled to have a logic high level in response to the control signal ESCTR having a logic low level. That is, the internal refresh signal IREF may be generated to have a logic high level after a predetermined time period from the point of time T6 when the refresh signal REF is inputted.

At a point of time T10, the command decoder 110 of the command processing circuit 100 may regenerate the refresh signal REF having a logic high level in response to the internal refresh signal IREF. The refresh signal REF generated by the internal refresh signal IREF means a signal for executing the second refresh operation.

The error information storage circuit 500 may output the first to $M^{th}$ target addresses TG_ADD<1:M> including positional information on memory cells having erroneous data, in response to the control signal ESCTR and the refresh signal REF.

The row address generation circuit 310 may output the first to $M^{th}$ target addresses TG_ADD<1:M> as the first to $M^{th}$ row addresses RADD<1:M> in response to the control signal ESCTR.

The row control circuit 440 may activate a word line (not illustrated) connected to a failed memory cell (not illustrated) according to the first to $M^{th}$ row addresses RADD<1:M> in response to the bank selection signal BS.

The column control circuit 450 may select memory cells (not illustrated) connected to a word line (not illustrated) that is selected according to the first to $K^{th}$ column addresses CADD<1:K> in response to the bank selection signal BS and may extract error information from the data stored in the selected memory cells (not illustrated). The column control circuit 450 may correct errors of the data using the extracted error information to store the corrected data in multiple memory cells (not illustrated) and may store the error information in parity cells (not illustrated). The column control circuit 450 may output the data stored in the multiple memory cells through first to $J^{th}$ global lines GIO<1:J>.

The data latch circuit 600 may latch the data on the first to $J^{th}$ global lines GIO<1:J> to output the latched data to the first to $J^{th}$ I/O lines IO<1:J>.

The I/O circuit 700 may output the data on the first to $J^{th}$ I/O lines IO<1:J> as the first to $J^{th}$ external data DQ<1:J>.

As described above, the semiconductor system according to an embodiment may correct errors of the data stored in failed memory cells having a short retention time in the refresh operation to prevent data errors.

Figure 11:
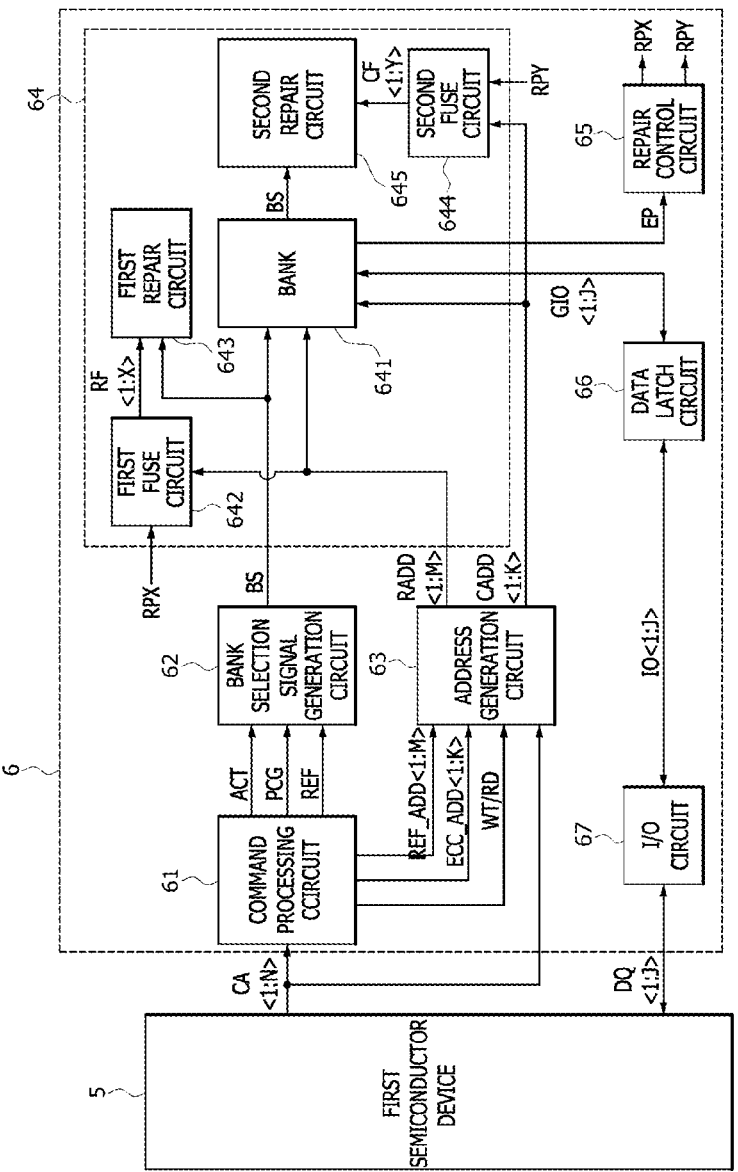
FIG. 11 is a block diagram illustrating a representation of an example a configuration of a semiconductor system according to an embodiment of the present disclosure.

FIG. 11 is a block diagram illustrating a configuration of a semiconductor system according to an embodiment of the present disclosure.

Referring to FIG. 11, a semiconductor system according to an embodiment of the present disclosure may include a first semiconductor device 5 and a second semiconductor device 6. The second semiconductor device 6 may include a command processing circuit 61, a bank selection signal generation circuit 62, an address generation circuit 63, a memory area 64, a repair control circuit 65, a data latch circuit 66, and an I/O circuit 67.

The first semiconductor device 5 may output first to $N^{th}$ command/address signals CA<1:N> and may receive or output first to $J^{th}$ external data DQ<1:J>.

The command processing circuit 61 may decode the first to $N^{th}$ command/address signals CA<1:N> to generate an active signal ACT, a write signal WT, a read signal RD, a precharge signal PCG, and a refresh signal REF. The command processing circuit 61 may also generate first to $M^{th}$ refresh addresses REF_ADD<1:M> and first to $K^{th}$ correction addresses ECC_ADD<1:K> which are sequentially counted, in response to the refresh signal REF. The command processing circuit 61 may have the same configuration as the command processing circuit 10 illustrated in FIG. 1 to perform the same operation. Thus, a description of the command processing circuit 61 will be omitted hereinafter.

The bank selection signal generation circuit 62 may generate a bank selection signal BS which is enabled in response to the active signal ACT, the precharge signal PCG, and the refresh signal REF. The bank selection signal BS is illustrated as one signal for the sake of convenience of description, but may be configured by multiple signals to select any one of multiple banks which are included in the memory area 64. The bank selection signal generation circuit 62 may have the same configuration as the bank selection signal generation circuit 20 illustrated in FIG. 1 and the bank selection signal generation circuit 200 illustrated in FIG. 6.

The address generation circuit 63 may decode the first to $N^{th}$ command/address signals CA<1:N> in a write operation or a read operation to generate first to $M^{th}$ row addresses RADD<1:M> and first to $K^{th}$ column addresses CADD<1:K>. The address generation circuit 63 may output the first to $M^{th}$ refresh addresses REF_ADD<1:M> as the first to $M^{th}$ row addresses RADD<1:M> and may output the first to $K^{th}$ correction addresses ECC_ADD<1:K> as the first to $K^{th}$ column addresses CADD<1:K>, in a refresh operation. The address generation circuit 63 may have the same configuration as the address generation circuit 30 illustrated in FIG. 1 to perform the same operation. Thus, a description of the address generation circuit 63 will be omitted hereinafter to avoid duplicate explanation.

The memory area 64 may include a bank 641, a first fuse circuit 642, a first repair circuit 643, a second fuse circuit 644, and a second repair circuit 645.

The bank 641 may generate the error pulse signal EP which is enabled if the data stored in memory cells (not illustrated) selected according to the first to $M^{th}$ row addresses RADD<1:M> and the first to K$^{th}$ column addresses CADD<1:K> have an error in a read operation during the refresh operation and may also correct the errors of the data to store the corrected data in the selected memory cells and to store error information in parity cells in a write operation during the refresh operation. Here, the bank 641 may be configured to include the row control circuit 41, the column address circuit 42, and the cell array 43 which are described with reference to FIG. 1.

The first fuse circuit 642 may output first to X$^{th}$ row fuse signals RF<1:X> in response to a row repair signal RPX, if the first to M$^{th}$ row addresses RADD<1:M> have a combination for selecting the memory cell (not illustrated) having an error. Here, the first to X$^{th}$ row fuse signals RF<1:X> may be set as addresses for replacing the first to M$^{th}$ row addresses RADD<1:M>. The first fuse circuit 642 may be realized using a fuse array including multiple fuse cells.

The first repair circuit 643 may include multiple repair cells (not illustrated) which are connected to a redundancy word line which is selected according to the first to X$^{th}$ row fuse signals RF<1:X> in response to the bank selection signal BS.

The second fuse circuit 644 may output first to Y$^{th}$ column fuse signals CF<1:Y> in response to a column repair signal RPY, if the first to K$^{th}$ column addresses CADD<1:K> have a combination for selecting the memory cell (not illustrated) having an error. Here, the first to Y$^{th}$ column fuse signals CF<1:Y> may be set as addresses for replacing the first to K$^{th}$ column addresses CADD<1:K>. The second fuse circuit 644 may be realized using a fuse array including multiple fuse cells.

The second repair circuit 645 may include multiple repair cells (not illustrated) connected to a redundancy bit line which is selected according to the first to Y$^{th}$ column fuse signals CF<1:Y> in response to the bank selection signal BS.

The repair control circuit 65 may generate the row repair signal RPX and the column repair signal RPY which are enabled in response to the error pulse signal EP.

The data latch circuit 66 may latch the data on the first to J$^{th}$ global lines GIO<1:3> to output the latched data to first to J$^{th}$ I/O lines IO<1:J>. The data latch circuit 66 may latch the data on the first to J$^{th}$ I/O lines IO<1:J> to output the latched data to the first to J$^{th}$ global lines GIO<1:J>. The data latch circuit 66 may have the same configuration as the data latch circuit 50 illustrated in FIG. 1.

The I/O circuit 67 may output the data on the first to J$^{th}$ I/O lines IO<1:J> as the first to J$^{th}$ external data DQ<1:J>. The I/O circuit 67 may output the first to J$^{th}$ external data DQ<1:J> generated from the first semiconductor device 5 to the first to J$^{th}$ I/O lines IO<1:J>. The I/O circuit 67 may have the same configuration as the I/O circuit 60 illustrated in FIG. 1.

A semiconductor system comprising a first semiconductor device configured for outputting command/address signals and a second semiconductor device configured for outputting data in a read operation during a refresh operation according to a combination of the command/address signals, configured for extracting error information from the data, configured for storing the error information in the second semiconductor device in a write operation during the refresh operation, and configured for replacing row addresses and column addresses for selecting the data having an error with other addresses according to the error information.

Wherein the error information is positional information of a failed memory cell having a retention time which is less than a retention time of a normal memory cell.

Wherein the write operation is an operation that restores corrected data obtained by correcting errors of data which are outputted in the read operation.

Wherein the second semiconductor device includes a command processing circuit configured for decoding the command/address signals to generate an active signal, a write signal, a read signal, a precharge signal, and a refresh signal and configured for generating refresh addresses and correction addresses which are sequentially counted based on the refresh signal, an address generation circuit configured for decoding the command/address signals in the read operation or the write operation to generate the row addresses and the column addresses and configured for generating the row addresses and the column addresses from the refresh addresses and the correction addresses in the refresh operation, a memory area configured for generating an error pulse signal which is enabled if the data stored in memory cells which are selected according to a combination of the row addresses and the column addresses have an error in the read operation of the refresh operation and configured for correcting the errors of the data to store the corrected data and the error information therein in the write operation of the refresh operation and a repair control circuit configured for generating a row repair signal and a column repair signal based on the error pulse signal.

Wherein the memory area replaces the row addresses and the column addresses with other addresses using the error information based on the row repair signal and the column repair signal.

Wherein the precharge signal is enabled after a predetermined time period from a point of time when the refresh signal is enabled.

Wherein the command processing circuit includes a command decoder configured for decoding the command/address signals to generate the active signal, the refresh signal, an internal precharge signal, an internal write signal, and an internal read signal, a delay setting circuit configured for delaying the refresh signal to generate a refresh read signal, a refresh write signal, and a refresh precharge signal which are sequentially enabled, a logic circuit configured for generating the precharge signal if the internal precharge signal or the refresh precharge signal is enabled, configured for generating the write signal if the internal write signal or the refresh write signal is enabled, and configured for the read signal if the internal read signal or the refresh read signal is enabled and a control circuit configured for generating the refresh addresses and the correction addresses which are sequentially counted based on the refresh signal.

Wherein the delay setting circuit includes a first delay circuit configured for delaying the refresh signal by a first delay time to generate the refresh read signal based on the refresh signal, a second delay circuit configured for delaying the refresh read signal by a second delay time to generate the refresh write signal based on the refresh signal and a third delay circuit configured for delaying the refresh write signal by a third delay time to generate the refresh precharge signal based on the refresh signal.

Wherein the control circuit includes a counting signal generation circuit configured for generating a counting signal which is enabled after a predetermined time period from a point of time when the refresh signal is enabled, a counter configured for generating the refresh addresses which are counted based on the counting signal and configured for generating a counting control signal which is enabled if entire bits of the refresh addresses are counted and a correction address generation circuit configured for generating the correction addresses which are counted based on the counting control signal.

Wherein the correction address generation circuit is configured for generating the correction addresses which are sequentially counted based on the counting control signal.

Wherein the address generation circuit includes a row address generation circuit configured for decoding the command/address signals to generate the row addresses or outputting the refresh addresses as the row addresses, based on the write signal and the read signal and a column address generation circuit configured for decoding the command/address signals to generate the column addresses or outputting the correction addresses as the column addresses, based on the write signal and the read signal.

Wherein the memory area includes a bank configured for extracting the error information of the data stored in memory cells which are selected according to a combination of the row addresses and the column addresses in the read operation, configured for correcting the errors of the data to store the corrected data in the bank, and configured for storing the error information in a parity cell, a first fuse circuit configured for outputting a row repair signal based on the row repair signal if the row addresses have a combination for selecting the memory cell having the error, a first repair circuit configured for including a plurality of repair word lines, one of which is selected according to the row repair signal based on the bank selection signal, a second fuse circuit configured for outputting a column repair signal based on the column repair signal if the column addresses have a combination for selecting the memory cell having the error and a second repair circuit configured for including a plurality of repair bit lines, one of which is selected according to the column repair signal based on the bank selection signal.

Wherein each of the first fuse circuit and the second fuse circuit includes multiple fuse cells.

As described above, a semiconductor system according to an embodiment of the present disclosure may correct errors of the data stored in memory cells having a short retention time during a refresh operation to prevent data errors. In addition, the semiconductor system according to an embodiment of the present disclosure may replace the failed memory cells having a small retention time with the repair cells during the refresh operation.

Figure 12:
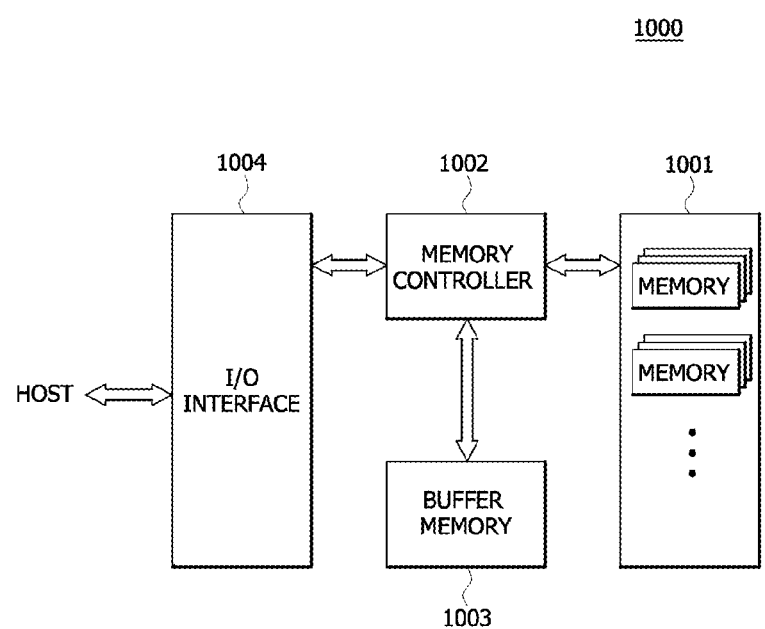
FIG. 12 is a block diagram illustrating a representation of an example a configuration of an electronic system employing the semiconductor device or the semiconductor system illustrating in FIG. 1 to FIG. 11.

The second semiconductor device or the semiconductor system described with reference to FIGS. 1 to 11 may be applied to an electronic system that includes a memory system, a graphic system, a computing system, a mobile system, or the like. For example, as illustrated in FIG. 12, an electronic system 1000 according an embodiment may include a data storage circuit 1001, a memory controller 1002, a buffer memory 1003, and an input/output (I/O) interface 1004.

The data storage circuit 1001 may store data which are outputted from the memory controller 1002 or may read and output the stored data to the memory controller 1002, according to a control signal generated from the memory controller 1002. The data storage circuit 1001 may include the second semiconductor device 2 illustrated in FIG. 1, the second semiconductor device 4 illustrated in FIG. 6, or the second semiconductor device 6 illustrated in FIG. 11. The data storage circuit 1001 may include a nonvolatile memory that can retain their stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage circuit 1001 or the buffer memory 1003 or for outputting the data stored in the data storage circuit 1001 or the buffer memory 1003. The memory controller 1002 may include the first semiconductor device 1 illustrated in FIG. 1, the first semiconductor device 3 illustrated in FIG. 6, or the first semiconductor device 5 illustrated in FIG. 11. Although FIG. 12 illustrates the memory controller 1002 with a single block, the memory controller 1002 may include one controller for controlling the data storage circuit 1001 comprised of a nonvolatile memory and another controller for controlling the buffer memory 1003 comprised of a volatile memory.

The buffer memory 1003 may temporarily store the data which are processed by the memory controller 1002. That is, the buffer memory 1003 may temporarily store the data which are outputted from or to be inputted to the data storage circuit 1001. The buffer memory 1003 may store the data, which are outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data generated from the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB), a multi-media card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

What is claimed is:
1. A semiconductor system comprising:
a first semiconductor circuit configured for outputting command and address (command/address) signals; and
a second semiconductor circuit configured for:
during a refresh operation, outputting data in a read operation, according to a combination of the command/address signals,
extracting error information from the data, and
during a refresh operation, correcting errors of the data, by a column control circuit, using the error information in a write operation, to store the corrected data in the second semiconductor circuit, and to store the error information in the second semiconductor circuit, wherein the corrected data is written back into a memory area of the second semiconductor circuit from the column control circuit.

2. The system of claim 1, wherein the write operation is an operation that restores the corrected data obtained by correcting erroneous data which are outputted in the read operation.

3. The system of claim 1, wherein the second semiconductor circuit includes:
a command processing circuit configured for:
decoding the command/address signals to generate an active signal, a write signal, a read signal, a precharge signal, and a refresh signal, and
generating refresh addresses and correction addresses which are sequentially counted in response to the refresh signal;
an address generation circuit configured for:
decoding the command/address signals in the read operation or the write operation to generate row addresses and column addresses, and
generating the row addresses and the column addresses from the refresh addresses and the correction addresses in the refresh operation; and
a memory area configured for:
extracting the error information of the data which are stored in memory cells that are selected according to a combination of the row addresses and the column addresses in the read operation,
correcting errors of the data to store the corrected data therein, and
storing the error information in a parity cell.

4. The system of claim 3, wherein the precharge signal is enabled after a predetermined time period from a point of time when the refresh signal is enabled.

5. The system of claim 3, wherein the command processing circuit includes:
a command decoder configured for decoding the command/address signals to generate the active signal, the refresh signal, an internal precharge signal, an internal write signal, and an internal read signal;
a delay setting circuit configured for delaying the refresh signal to generate a refresh read signal, a refresh write signal, and a refresh precharge signal which are sequentially enabled;
a logic circuit configured for:
generating the precharge signal if the internal precharge signal or the refresh precharge signal is enabled,
generating the write signal if the internal write signal or the refresh write signal is enabled, and
generating the read signal if the internal read signal or the refresh read signal is enabled; and
a control circuit configured for generating the refresh addresses and the correction addresses which are sequentially counted in response to the refresh signal.

6. The system of claim 5, wherein the delay setting circuit includes:
a first delay circuit configured for delaying the refresh signal by a first delay time to generate the refresh read signal in response to the refresh signal;
a second delay circuit configured for delaying the refresh read signal by a second delay time to generate the refresh write signal in response to the refresh signal; and a third delay circuit configured for delaying the refresh write signal by a third delay time to generate the refresh precharge signal in response to the refresh signal.

7. The system of claim 5, wherein the control circuit includes:
a counting signal generation circuit configured for generating a counting signal which is enabled after a predetermined time period from a point of time when the refresh signal is enabled;
a counter configured for:
generating the refresh addresses which are counted in response to the counting signal and
generating a counting control signal which is enabled if entire bits of the refresh addresses are counted; and
a correction address generation circuit configured for generating the correction addresses which are counted in response to the counting control signal.

8. The system of claim 7, wherein the correction address generation circuit is configured for generating the correction addresses which are sequentially counted in response to the counting control signal.

9. The system of claim 3, wherein the address generation circuit includes:
a row address generation circuit configured for decoding the command/address signals to generate the row addresses or outputting the refresh addresses as the row addresses, in response to the write signal and the read signal; and
a column address generation circuit configured for decoding the command/address signals to generate the column addresses or outputting the correction addresses as the column addresses, in response to the write signal and the read signal.

10. The system of claim 3, wherein the memory area includes:
a row control circuit configured for selectively activating one of word lines according to the row addresses in response to a bank selection signal which is enabled in the refresh operation;
a column control circuit configured for:
selecting the memory cells connected to the activated word line according to the column addresses in response to the bank selection signal,
extracting the error information from the data stored in the memory cells, configured for correcting errors of the data using the error information to store the corrected data in the memory cells, and
storing the error information in the parity cell; and
a cell array configured for including the memory cells and the parity cell which are connected to the word lines.

11. The system of claim 10, wherein the column control circuit includes:
an error correction circuit configured for:
extracting the error information from the data on a bank line which is connected to the memory cells in response to the read signal,
correcting errors of the data using the error information to output the corrected data to a global line,
outputting the data which has an error which is corrected in response to the write signal to the bank line, and
outputting the error information to a parity line; and
a sense amplifier configured for:
sensing and amplifying data on the bank line which is connected to the memory cells that are selected by the column addresses to store the amplified data in the sense amplifier and storing the error information on the parity line in the parity cell which is selected by the column address.

12. The system of claim 11, wherein the error correction circuit includes:
a pulse signal generation circuit configured for generating a write pulse signal in response to the write signal and a read pulse signal in response to the read signal;
a latch circuit configured to latch the data on the bank line in response to the write pulse signal or the read pulse signal to generate internal data and to latch the error information on the parity line in response to the read pulse signal to generate parity signals;
a code generation circuit configured to sense logic levels of the internal data to generate error codes and parity codes including the error information, and output the parity signals as parity codes;
a data repeater configured to output the data on the global line to the bank line in response to the write pulse signal; and
a parity repeater configured to output the parity codes to the parity line in response to the write pulse signal.

13. The system of claim 1, wherein the error information is positional information of a failed memory cell having a retention time which is less than a retention time of a normal memory cell.

14. A semiconductor system comprising:
a first semiconductor circuit configured for outputting command/address signals; and
a second semiconductor circuit configured for:
during a first refresh operation, outputting data in a read operation, according to a combination of the command/address signals,
extracting error information of the data to store the error information in the second semiconductor circuit, and
during a second refresh operation, correcting errors of the data, by a column control circuit, stored in memory cells, which are selected according to the error information in a write operation, to store the corrected data in the second semiconductor circuit,
wherein the corrected data is written back into a memory area of the second semiconductor circuit from the column control circuit.

15. The system of claim 14, wherein the first and second refresh operations are sequentially performed.

16. The system of claim 14, wherein the write operation is an operation that restores the corrected data obtained by correcting an erroneous data which is outputted in the read operation.

17. The system of claim 14, wherein the second semiconductor circuit includes:
a command processing circuit configured for:
decoding the command/address signals to generate an active signal, a write signal, a read signal, a precharge signal, and a refresh signal, generating refresh addresses and correction addresses which are sequentially counted in response to the refresh signal, and
generating a control signal which is enabled in the second refresh operation;
an address generation circuit configured for:
decoding the command/address signals in the read operation or the write operation to generate row addresses and column addresses,
generating the row addresses and the column addresses from the refresh addresses and the correction addresses in the first refresh operation, and outputting a target address including the error information as the row address in response to the control signal;
a memory area configured for:
generating an error pulse signal which is enabled if an error of the data stored in memory cells which are selected according to a combination of the row addresses and the column addresses occurs in the read operation of the first refresh operation, correcting errors of the data in the write operation of the second refresh operation, and
storing the error information in the memory area; and
an error information storage circuit configured for:
storing the row address as the target address in response to the error pulse signal and
outputting the target address in response to the control signal.

18. The system of claim 17, wherein the precharge signal is enabled after a predetermined time period from a point of time when the refresh signal is enabled.

19. The system of claim 17, wherein the command processing circuit includes:
a command decoder configured for:
decoding the command/address signals to generate the active signal, the refresh signal, an internal precharge signal, an internal write signal, and an internal read signal and
regenerating the refresh signal in response to an internal refresh signal;
a delay setting circuit configured for delaying the refresh signal to generate a refresh read signal, a refresh write signal, and a refresh precharge signal which are sequentially enabled;
a logic circuit configured for:
generating the precharge signal if the internal precharge signal or the refresh precharge signal is enabled,
generating the write signal if the internal write signal or the refresh write signal is enabled, and
generating the read signal if the internal read signal or the refresh read signal is enabled;
a control circuit configured for:
generating the refresh addresses and the correction addresses which are sequentially counted in response to the refresh signal and
generating the internal refresh signal which is enabled in response to the control signal and the refresh precharge signal; and
a control signal generation circuit configured for generating the control signal which is enabled if entire bits of the correction addresses are counted.

20. The system of claim 19, wherein the delay setting circuit includes:
a first delay circuit configured for delaying the refresh signal by a first delay time to generate the refresh read signal in response to the refresh signal;
a second delay circuit configured for delaying the refresh read signal by a second delay time to generate the refresh write signal in response to the refresh signal; and
a third delay circuit configured for delaying the refresh write signal by a third delay time to generate the refresh precharge signal in response to the refresh signal.

21. The system of claim 19, wherein the control circuit includes:
a refresh control circuit configured for:
generating a counting signal which is enabled after a predetermined time period from a point of time when the refresh signal is enabled and generating the internal refresh signal which is enabled in response to the control signal and the refresh precharge signal;
a counter configured for:
generating the refresh addresses which are counted in response to the counting signal and
generating a counting control signal which is enabled if entire bits of the refresh addresses are counted; and
a correction address generation circuit configured for generating the correction addresses which are counted in response to the counting control signal.

22. The system of claim 21, wherein the correction address generation circuit is configured for generating the correction addresses which are sequentially counted in response to the counting control signal.

23. The system of claim 17, wherein the address generation circuit includes:
a row address generation circuit configured for:
decoding the command/address signals to generate the row addresses or outputting the refresh addresses as the row addresses, in response to the write signal and the read signal and
outputting the target address as the row address in response to the control signal; and
a column address generation circuit configured for decoding the command/address signals to generate the column addresses or outputting the correction addresses as the column addresses, in response to the write signal and the read signal.

24. The system of claim 17, wherein the memory area includes:
a row control circuit configured for selectively activating one of word lines according to the row addresses in response to a bank selection signal which is enabled during the first and second refresh operations;
a column control circuit configured for:
selecting the memory cells which are connected to the selected word line according to the column addresses in response to the bank selection signal,
extracting the error information from the data stored in the memory cells,
correcting errors of the data using the error information to store the corrected data in the memory cells,
storing the error information in the parity cell, and
generating the error pulse signal which is enabled if errors of the data occur; and
a cell array configured for including the memory cells and the parity cell which are connected to the word lines.

25. The system of claim 24, wherein the column control circuit includes:
an error correction circuit configured for:
extracting the error information from the data on a bank line which is connected to the memory cells in response to the read signal,
correcting errors of the data using the error information to output the corrected data to a global line,
outputting the data whose error is corrected in response to the write signal to the bank line,
outputting the error information to a parity line, and
outputting the error pulse signal if errors of the data occur; and
a sense amplifier configured for sensing and amplifying data on the bank line which is connected to the memory cells that are selected by the column addresses to store the amplified data therein and configured for storing the error information on the parity line in the parity cell which is selected by the column address.

26. The system of claim 25, wherein the error correction circuit includes:
a pulse signal generation circuit configured for generating a write pulse signal in response to the write signal and a read pulse signal in response to the read signal;
a latch circuit configured to latch the data on the bank line in response to the write pulse signal or the read pulse signal to generate internal data and to latch the error information on the parity line in response to the read pulse signal to generate parity signals;
a code generation circuit configured to sense logic levels of the internal data to generate error codes and parity codes including the error information, and output the parity signals as parity codes;
a data repeater configured to output the data on the global line to the bank line in response to the write pulse signal;
a parity repeater configured to output the parity codes to the parity line in response to the write pulse signal; and
a error pulse generation circuit configured to generate the error pulse signal if at least one of the error codes is enabled, in response to the read pulse signal.

27. The system of claim 14, wherein the error information is positional information of a failed memory cell having a retention time which is less than a retention time of a normal memory cell.

* * * * *